(12) United States Patent
Lo et al.

(10) Patent No.: US 6,933,175 B2
(45) Date of Patent: Aug. 23, 2005

(54) METHOD OF FABRICATING A THIN AND FINE BALL-GRID ARRAY PACKAGE WITH EMBEDDED HEAT SPREADER

(75) Inventors: Randy H.Y. Lo, Taipei (TW); Chi-Chuan Wu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/389,352

(22) Filed: Mar. 13, 2003

(65) Prior Publication Data

US 2003/0155648 A1 Aug. 21, 2003

Related U.S. Application Data

(62) Division of application No. 09/624,093, filed on Jul. 24, 2000, now Pat. No. 6,541,310.

(51) Int. Cl.[7] .............................................. H01L 21/44
(52) U.S. Cl. ....................................... 438/122; 438/125
(58) Field of Search .......................... 257/706; 438/122, 438/125

(56) References Cited

U.S. PATENT DOCUMENTS

| | | | |
|---|---|---|---|
| 5,216,278 A | | 6/1993 | Lin et al. |
| 5,334,872 A | * | 8/1994 | Ueda et al. ................. 257/675 |
| 5,672,547 A | * | 9/1997 | Jeng et al. .................. 438/122 |
| 5,724,729 A | * | 3/1998 | Sherif et al. .................. 29/840 |
| 5,776,798 A | | 7/1998 | Quan et al. |
| 5,822,848 A | | 10/1998 | Chiang |
| 5,872,395 A | | 2/1999 | Fujimoto |
| 5,976,912 A | * | 11/1999 | Fukutomi et al. ........... 438/110 |
| 5,977,626 A | | 11/1999 | Wang et al. |
| 6,061,241 A | * | 5/2000 | Handforth et al. .......... 361/704 |
| 6,117,704 A | | 9/2000 | Yamaguchi et al. |
| 6,188,578 B1 | | 2/2001 | Lin et al. |
| 6,246,115 B1 | * | 6/2001 | Tang et al. .................. 257/706 |
| 6,258,630 B1 | | 7/2001 | Kawahara |
| 6,268,654 B1 | * | 7/2001 | Glenn et al. ................ 257/704 |
| 6,314,639 B1 | | 11/2001 | Corisis |

FOREIGN PATENT DOCUMENTS

JP          61188999 A    *  8/1986    ............ H05K/7/20

* cited by examiner

*Primary Examiner*—George Eckert
*Assistant Examiner*—N. Drew Richards
(74) *Attorney, Agent, or Firm*—Peter F. Corless; Steven M. Jensen; Edwards & Angell, LLP

(57) ABSTRACT

A method is proposed for fabricating a TFBGA (Thin & Fine Ball-Grid Array) package with embedded heat spreader. Conventionally, since an individual TFBGA package is quite small in size, it would be highly difficult to incorporate an embedded heat spreader therein. As a solution to this problem, the proposed method utilizes a single substrate predefined with a plurality of package sites, and further utilizes a heat-spreader frame including an integrally-formed matrix of heat spreaders each corresponding to one of the package sites on the substrate. A batch of semiconductor chips are then mounted on the respective package sites on the substrate. During the encapsulation process, a single continuous encapsulation body is formed to encapsulate the entire heat-spreader frame and all the semiconductor chips. After ball implantation, a singulation process is performed to cut apart the encapsulation body into individual package units, each serving as the intended TFBGA package. In the foregoing process, since the entirety of the heat-spreader frame is relatively large in size as compared to the size of an individual TFBGA package, it can be easily handled, so that the embedding of a heat spreader in each package unit can be easily carried out.

8 Claims, 11 Drawing Sheets

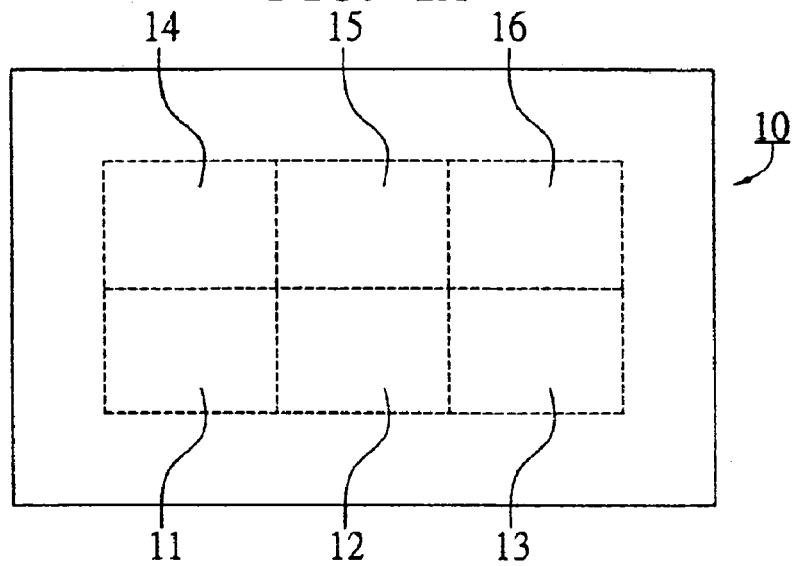
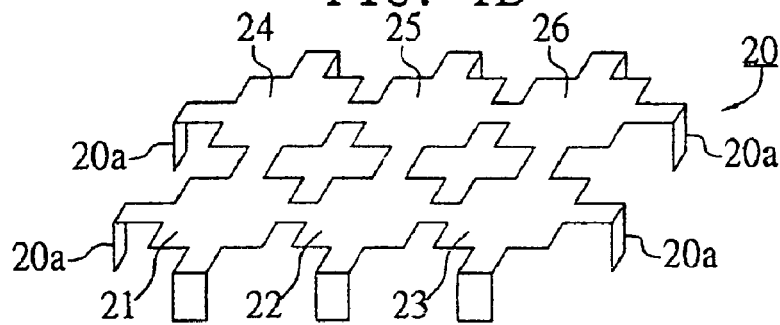
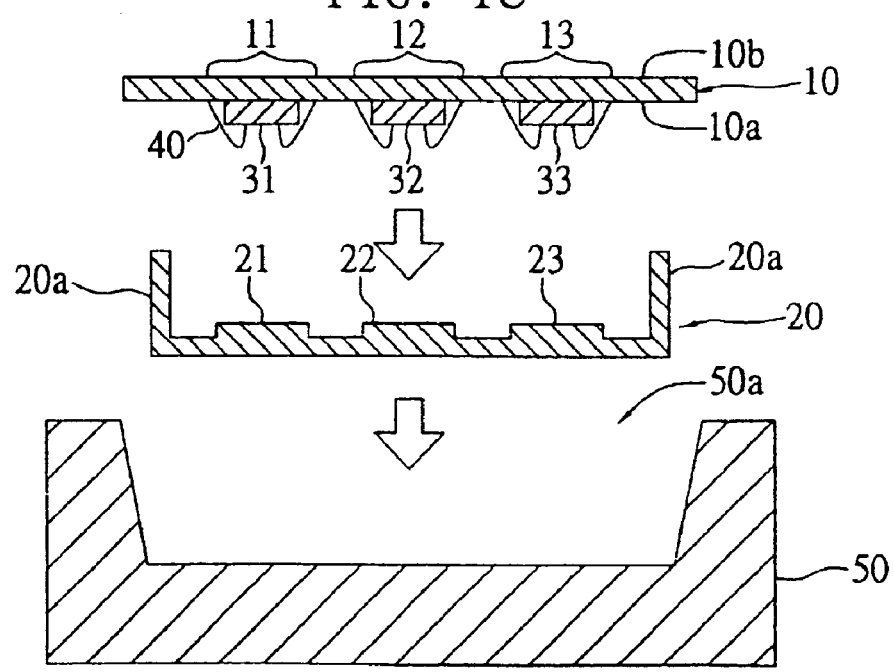

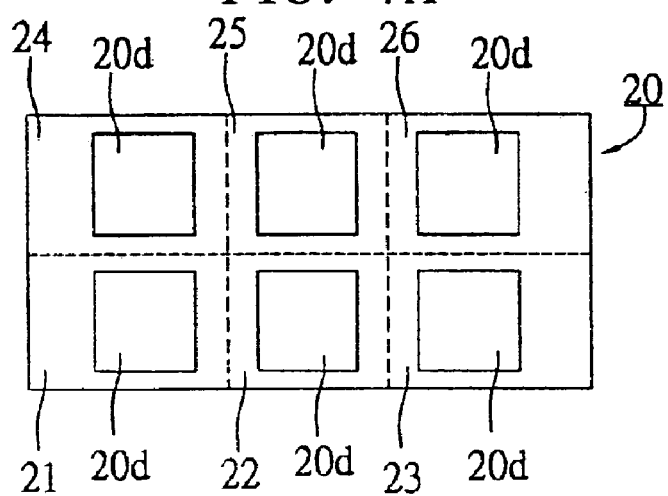
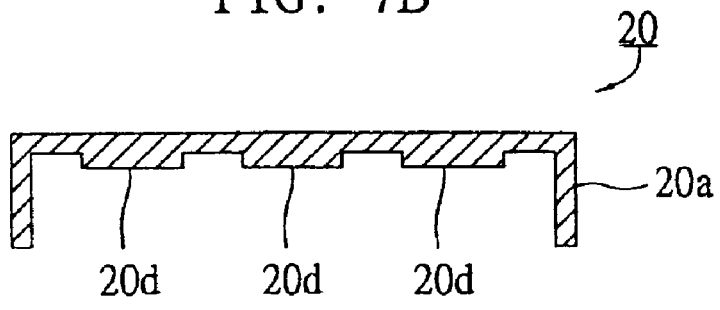
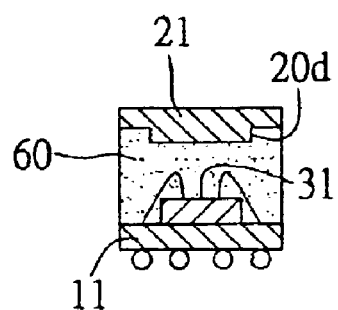

METHOD OF FABRICATING A THIN AND FINE BALL-GRID ARRAY PACKAGE WITH EMBEDDED HEAT SPREADER

This application is a divisional of application Ser. No. 09/624,093 filed on Jul. 24, 2000 now U.S. Pat. No. 6,541,310.

BACKGROUND OF THE INVENTION

1. Field of the Invention

This invention relates to integrated circuit packaging technology, and more particularly, to a method of fabricating a TFBGA (Thin & Fine Ball-Grid Array) package with embedded heat spreader.

2. Description of Related Art

BGA (Ball-Grid Array) is an advanced type of integrated circuit packaging technology which is characterized in the package configuration of a two-dimensional array of solder balls on the bottom surface of the substrate where the semiconductor chip is mounted. These solder balls allow the entire package body to be mechanically bonded and electrically coupled to a printed circuit board (PCB).

TFBGA (Thin & Fine Ball-Grid Array) is a downsized type of BGA technology that provides integrated circuit packages in very small sizes, which are customarily fabricated in batch from a single chip carrier, such as a substrate, predefined with a matrix of package sites, from each of which a single TFBGA package unit is fabricated. Conventionally, however, it would be highly difficult to incorporate an embedded heat spreader in each individual TFBGA package since each individual TFBGA package is quite small in size, typically from 5 mm×5 mm to 15 mm×15 mm (millimeter), and the separation between neighboring package sites on the substrate is only from 0.2 mm to 0.3 mm.

Related patents include, for example, the U.S. Pat. No. 5,977,626 entitled "THERMALLY AND ELECTRICALLY ENHANCED PBGA PACKAGE"; the U.S. Pat. No. 5,216,278 entitled "SEMICONDUCTOR DEVICE HAVING A PAD ARRAY CARRIER PACKAGE"; and the U.S. Pat. No. 5,776,798 entitled "SEMICONDUCTOR PACKAGE AND METHOD THEREOF"; to name just a few.

The U.S. Pat. No. 5,977,626 teaches the embedding of a heat spreader in a BGA package, while the U.S. Pat. No. 5,216,278 teaches the mounting of a heat spreader over the semiconductor chip to facilitate heat dissipation from the encapsulated chip. The U.S. Pat. No. 5,776,798 teaches a novel TFBGA package structure and fabrication thereof However, none of these patented technologies teach the embedding of a heat spreader in each TFBGA package. Therefore, there still exists a need in the semiconductor industry for a new integrated circuit packaging technology that can incorporate a heat spreader in a TFBGA package.

SUMMARY OF THE INVENTION

It is therefore an objective of this invention to provide a new integrated circuit packaging technology that can provide each TFBGA package with an embedded heat spreader to facilitate heat dissipation from the encapsulated chip.
In accordance with the foregoing and other objectives, the invention proposes a new method for fabricating a TFBGA package with embedded heat spreader. Broadly defined, the method of the invention comprises the following procedural steps: (1) preparing a substrate having a front surface and a back surface, and which is predefined with a plurality of package sites; (2) preparing a heat-spreader frame including an integrally-formed matrix of heat spreaders having a front surface and a back surface, each heat spreader corresponding to one of the predefined package sites on the substrate; (3) bonding and electrically-coupling a plurality of semiconductor chips to respective package sites on the front surface of the substrate; (4) assembling the heat-spreader frame to the substrate in such a manner that each heat spreader is positioned proximate to one of the semiconductor chips on the substrate; (5) performing an encapsulation process to form an encapsulation body which encapsulates the semiconductor chips and the heat-spreader frame; (6) performing a ball-implantation process to implant a plurality of solder balls on the back surface of the substrate; and (7) singulating through the encapsulation body to cut apart the plurality of package sites on the substrate into individual package units, each serving as the intended integrated circuit package.

The foregoing method of the invention is characterized in the use of the heat-spreader frame including an integrally-formed matrix of heat spreaders. Since the entire heat-spreader frame is relatively large in size as compared to the size of an individual TFBGA package, it would be as a whole significantly easier to handle during the fabrication process than a single piece of heat spreader, making embedding of a single piece of heat spreader in each TFBGA package easy to implement.

BRIEF DESCRIPTION OF DRAWINGS

The invention can be more fully understood by reading the following detailed description of the preferred embodiments, with reference made to the accompanying drawings, wherein:

FIGS. 1A–1F are schematic diagrams used to depict a first preferred embodiment of the method of the invention for TFBGA fabrication;

FIGS. 7A–7C are schematic diagrams of still another variety to the legged type of heat-spreader frame utilized by the invention;

DETAILED DESCRIPTION OF PREFERRED EMBODIMENTS

Figure 1D:
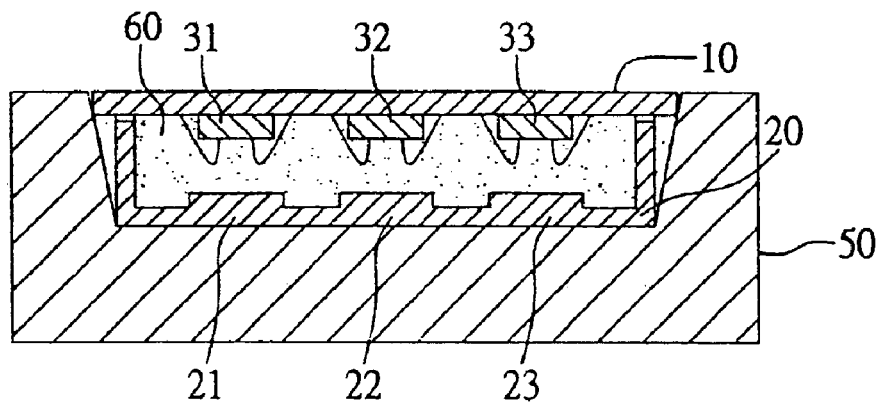

In accordance with the invention, various preferred embodiments are disclosed in full details in the following with reference to the accompanying drawings.

First Preferred Embodiment (FIGS. 1A–1F)

FIGS. 1A–1F are schematic sectional diagrams used to depict the procedural steps involved in the first preferred embodiment of the method of the invention for fabricating a TFBGA package with embedded heat spreader. It is to be noted that, by the invention, each TFBGA package is fabricated in batch, and not individually, from a single chip carrier.

Referring to FIG. 1A, by the method of the invention, the first step is to prepare a substrate 10 (or chip carrier), which can be a BT substrate, or an FR4 substrate, or a polyimide tape, and which is predefined with an array of package sites (in the example of FIG. 1A, a total of six (6) package sites, respectively designated by the reference numerals "11", "12", "13", "14", "15", and "16", are predefined; but it is to be noted that the number of package sites is an arbitrary design choice depending on the size of the substrate 10). Each of the package sites 11, 12, 13, 14, 15, 16 on the substrate 10 will be used as a base for the fabrication of a single unit of TFBGA package.

Referring further to FIG. 1B, the next step is to prepare a heat-spreader frame 20 including an integrally-formed matrix of heat spreaders (in the example of FIG. 1B, the heat-spreader frame 20 includes a total of six (6) heat spreaders, respectively designated by the reference numerals "21", "22", "23", "24", "25", and "26", which are provided in conjunction with the respective package sites 11, 12, 13, 14, 15, 16 on the substrate 10. It is to be noted that the number of heat spreaders on the heat-spreader frame 20 is an arbitrary design choice depending on the number of predefined package sites on the substrate 10.

The heat-spreader frame 20 can be a legged type or a non-legged type. In this first preferred embodiment, the heat-spreader frame 20 is a legged type having a plurality of legs 20a arranged on the peripheral edges thereof and bent down in perpendicular to the heat spreaders 21, 22, 23, 24, 25, 26 (the non-legged type is used in the second preferred embodiment, which will be described later in this specification).

Referring further to FIG. 1C, in the next step, a die-bonding process is performed to mount a batch of semiconductor chips (only three are shown in the sectional view of FIG. 1C, which are designated by the reference numerals 31, 32, 33 respectively) on the package sites 11, 12, 13 on the front surface 10a of the substrate 10 (note that only three of the six package sites 11, 12, 13, 14, 15, 16 shown in FIG. 1A are seen in the sectional view of FIG. 1C). Subsequently, a wire-bonding process is performed to electrically couple the semiconductor chips 31, 32, 33 to the substrate 10 by means of bonding wires 40, such as gold wires.

After that, the next step is to perform an encapsulation process using an encapsulation mold 50 having a downward-recessed cavity 50a. First, the heat-spreader frame 20 is dropped in an upside-down manner into the cavity 50a of the encapsulation mold 50, with its legs 20a pointing upwards; and next, the substrate 10, together with the semiconductor chips 31, 32, 33 mounted thereon, is turned upside down (i.e., with the back surface 10b of the substrate 10 facing upwards) and then placed on the heat-spreader frame 20, with the edge of its front surface 10a being adhered to the tips of the upward-pointing legs 20a of the heat-spreader frame 20.

Referring further to FIG. 1D, when the heat-spreader frame 20 and the substrate 10 are readily set in position in the cavity 50a of the encapsulation mold 50, an encapsulating material, such as resin, is injected into the cavity 50a of the encapsulation mold 50 to form a single continuous encapsulation body 60 which encapsulates all the semiconductor chips 31, 32, 33 and the heat-spreader frame 20.

Figure 1E:
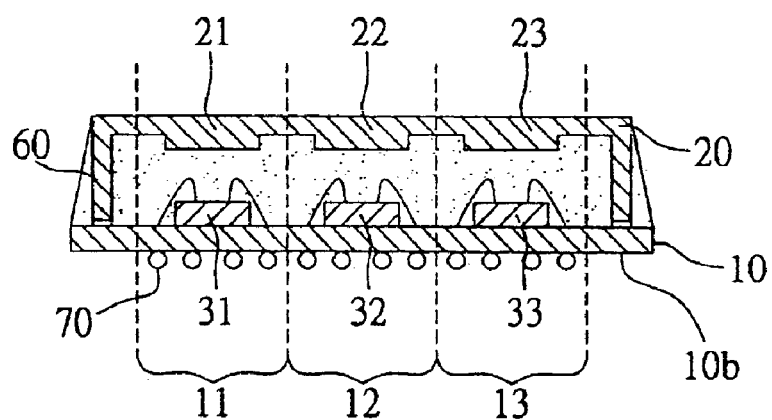

Referring further to FIG. 1E, as the encapsulation process is completed, the entire encapsulation body 60 is taken out of the encapsulation mold 50. Next, a ball-implantation process is performed to implant a plurality of solder balls 70 on the back surface 10b of the substrate 10.

Figure 1F:
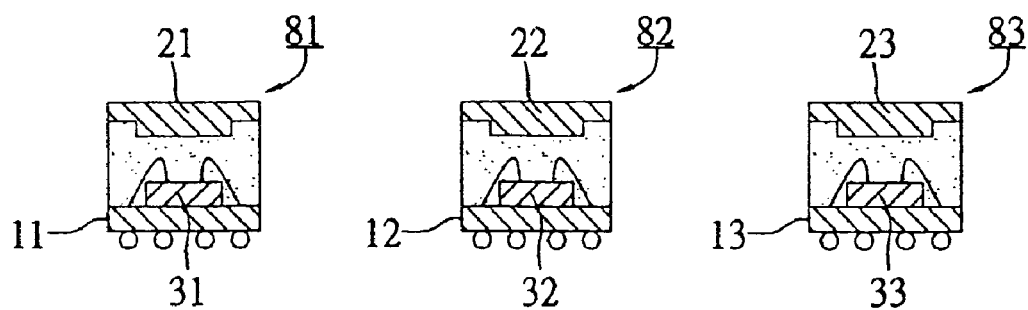

Referring further to FIG. 1F, in the next step, a singulation process is performed to saw through the encapsulation body 60 (along the dashed lines shown in FIG. 1E that delimit the predefined package sites 11, 12, 13 on the substrate 10), so as to cut apart the entire package body into individual package units as indicated by the reference numerals "81", "82", and "83" in FIG. 1F. Each of the package units 81, 82, 83 includes one of the package sites 11, 12, 13, one of the chips 31, 32, 33, and one of the heat spreaders 21, 22, 23. This completes the fabrication of a batch of TFBGA packages.

In the foregoing method of the invention, since the entire heat-spreader frame 20 is relatively large in size as compared to the size of an individual TFBGA package, it would be as a whole significantly easier to handle during the fabrication process than a single piece of heat spreader, making embedding of a single piece of heat spreader in each TFBGA package easy to implement.

Second Preferred Embodiment (FIGS. 2A–2E)

The second preferred embodiment of the method of the invention is described in the following with reference to FIGS. 2A–2E. In FIGS. 2A–2E, the same parts as the previous embodiment shown in FIGS. 1A–1F are labeled with the same reference numerals.

Figure 2A:
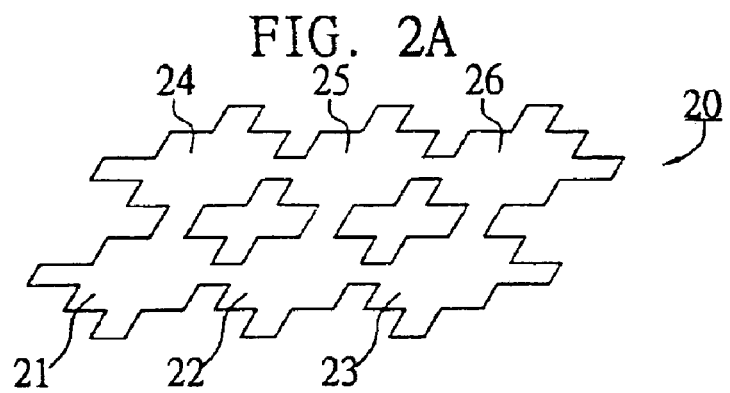
FIGS. 2A–2E are schematic diagrams used to depict a second preferred embodiment of the method of the invention for TFBGA fabrication.

As shown in FIG. 2A, the second preferred embodiment differs from the previous one in that the heat-spreader frame 20 utilized here is a non-legged type (i.e., the legs 20a shown in FIG. 1B of the previous embodiment are here not provided). Except this, the heat-spreader frame 20 used here is substantially the same in shape as the previous embodiment, which also includes an integrally-formed matrix of heat spreaders 21, 22, 23, 24, 25, 26. Beside the heat-spreader frame 20, all the other constituent parts of the second preferred embodiment are identical in structure as the previous embodiment, so description thereof will not be repeated here.

Figure 2B:
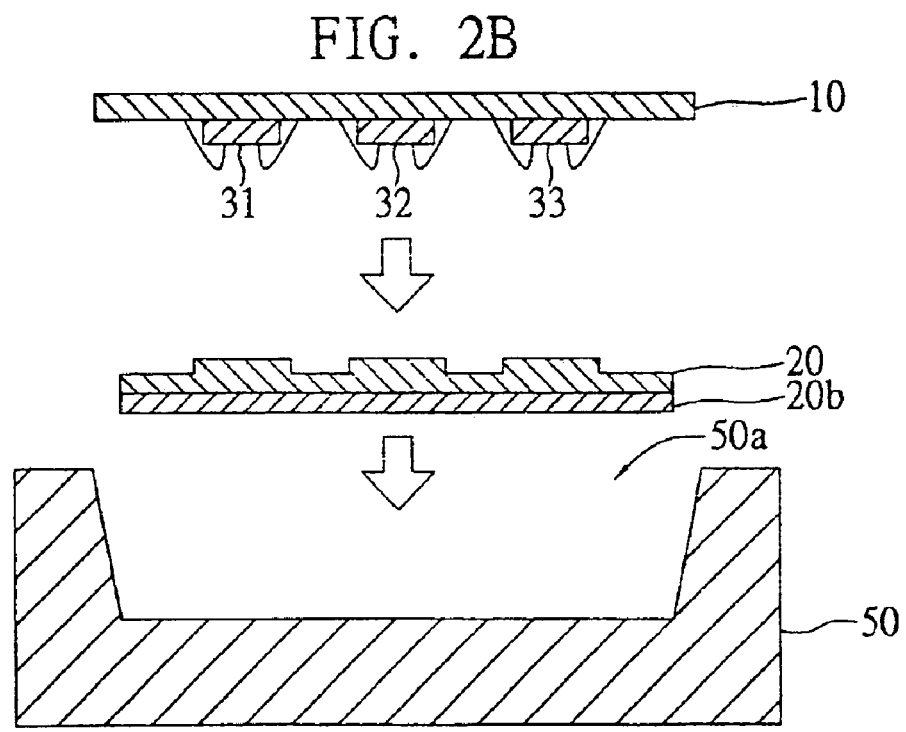

Referring next to FIG. 2B, during the encapsulation process, in order to prevent resin flash on the bottom surface of the heat-spreader frame 20, a flash-masking structure 20b is formed over the bottom surface of the heat-spreader frame 20. The flash-masking structure 20b can be, for example, a polyimide tape or an epoxy coating. The heat-spreader frame 20 and the substrate 10 are then placed set in the cavity 50a of the encapsulation mold 50 in the same manner as the previous embodiment (except in this case, the heat-spreader frame 20 has no legs to support the substrate 10).

Figure 2C:
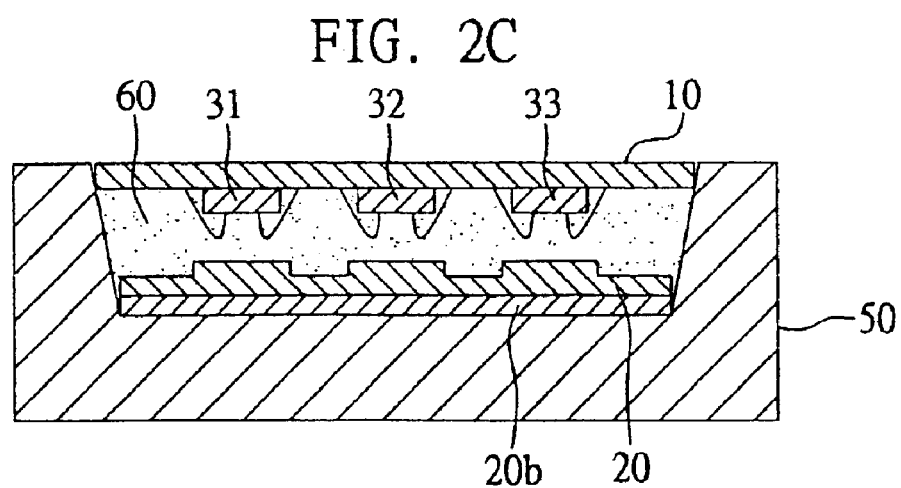

Referring further to FIG. 2C, when the heat-spreader frame 20 and the substrate 10 are readily set in position in the cavity 50a of the encapsulation mold 50, an encapsulating material, such as resin, is injected into the cavity 50a of the encapsulation mold 50 to form a single continuous encapsulation body 60 which encapsulates all the semiconductor chips 31, 32, 33 and the heat-spreader frame 20. During this process, however, part of the injected resin may be flashed onto the bottom surface of the flash-masking structure 20b that comes in touch with the bottom surface of the cavity 50a.

Figure 2D:
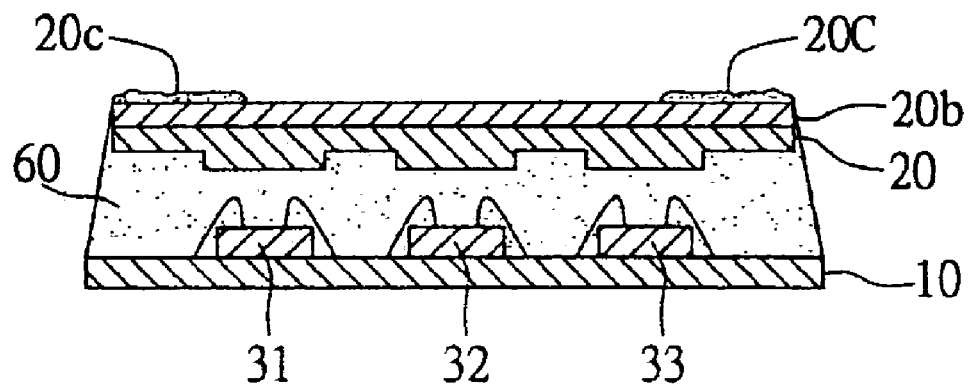

Referring further to FIG. 2D, as the encapsulation process is completed, the entire encapsulation body 60 is taken out of the encapsulation mold 50. From the encapsulation process, however, a small amount of flashed resin 20c might be left over the exposed surface of the flash-masking structure 20b over the heat-spreader frame 20.

Figure 2E:
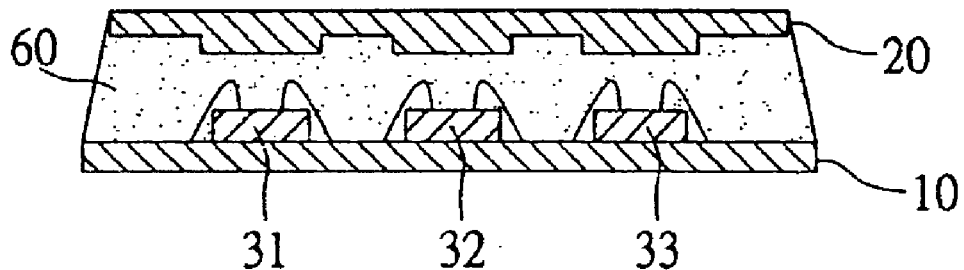

Referring further to FIG. 2E, in the next step, the flash-masking structure 20b, together with the flashed resin 20c thereon, are removed by using a special solvent or other suitable etching means. This allows no flashed resin to be left over the exposed surface of the heat-spreader frame 20. If the flash-masking structure 20b were not provided, the flashed resin 20c would be left directly over the exposed surface of the heat-spreader frame 20, which would then be very difficult to remove.

The subsequent steps of ball implantation and singulation are all the same as the previous embodiment, so description thereof will not be repeated.

The foregoing method of the invention allows the embedding of a flash-free heat spreader in each TFBGA package.

Figure 3A:
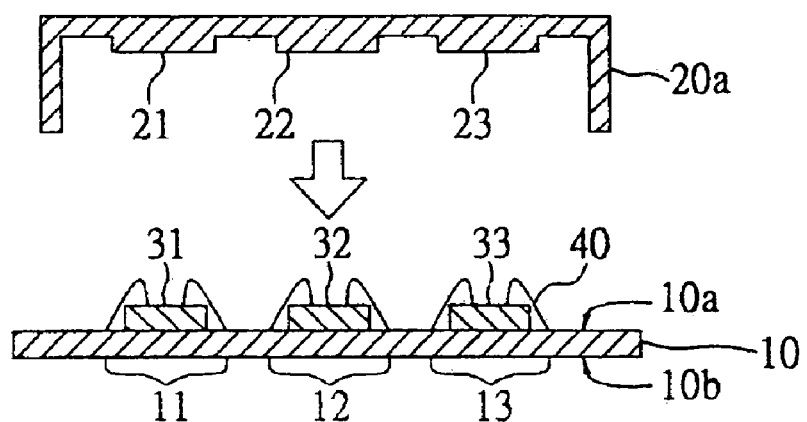
FIGS. 3A–3C are schematic diagrams used to depict a third preferred embodiment of the method of the invention for TFBGA fabrication.
Figure 3B:
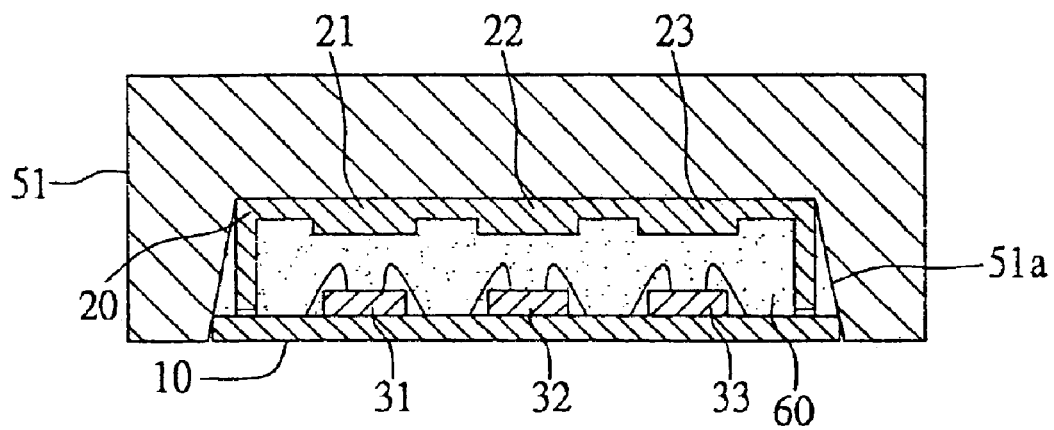
Figure 3C:
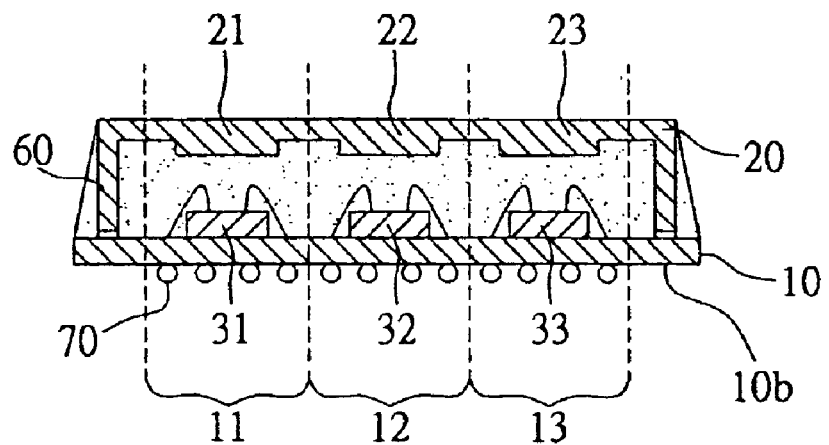

Third Preferred Embodiment (FIGS. 3A–3C)

The third preferred embodiment of the method of the invention is disclosed in the following with reference to FIGS. 3A–3C. In FIGS. 3A–3C, the same parts as the previous embodiments are labeled with the same reference numerals.

This embodiment is largely the same as the first embodiment except that the substrate 10 needs not be turned upside down during the encapsulation process. Details are described below.

Referring first to FIG. 3A, as the substrate 10 is readily mounted with the semiconductor chips 31, 32, 33, the tips of the legs 20a of the heat-spreader frame 20 are adhered by means of an adhesive agent (not shown) onto the front surface 10a of the substrate 10.

Referring further to FIG. 3B, the next step is to perform an encapsulation process, in which the substrate 10 together with the semiconductor chips 31, 32, 33 mounted thereon are placed in an encapsulation mold 51 having a bottom-side upward-recessed cavity 51a, without being turned upside down as in the case of the first embodiment, for the purpose of forming an encapsulation body 60 which encapsulates all the semiconductor chips 31, 32, 33 and the heat-spreader frame 20.

Referring further to FIG. 3C, as the encapsulation process is completed, the entire encapsulation body 60 is taken out of the encapsulation mold 51. Next, a ball-implantation process is performed to implant a plurality of solder balls 70 on the back surface 10b of the substrate 10. After this, a singulation process is performed to saw through the encapsulation body 60 along the dashed lines shown in FIG. 3C that delimit the predefined package sites 11, 12, 13 on the substrate 10. The subsequent steps are all the same as the first embodiment, so description thereof will not be repeated herein Fourth Preferred Embodiment (FIGS. 4A–4B)

The fourth preferred embodiment of the method of the invention is disclosed in the following with reference to FIGS. 4A–4B. In FIGS. 4A–4B, the same parts as the previous embodiments are labeled with the same reference numerals.

Figure 4A:
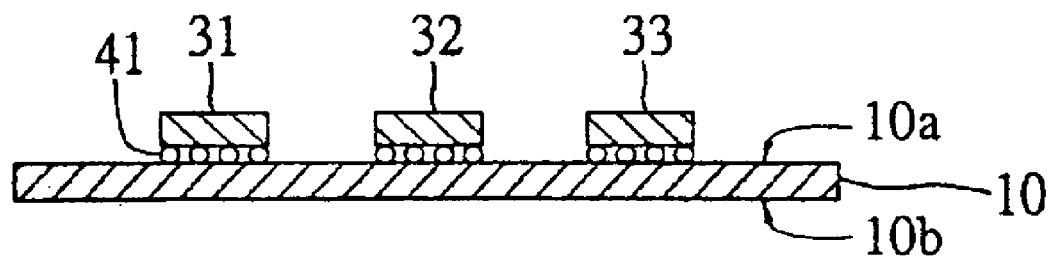
FIGS. 4A–4B are schematic diagrams used to depict a fourth preferred embodiment of the method of the invention for TFBGA fabrication.
Figure 4B:
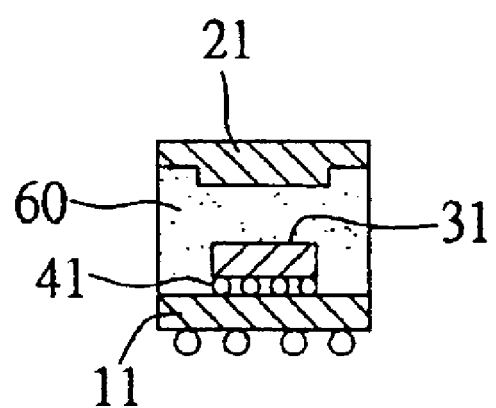

Referring to FIG. 4A, this embodiment differs from the previous ones only in that the semiconductor chips 31, 32, 33 are electrically coupled to the substrate 10 through the flip-chip technology by means of solder bumps 41 instead of the wire-bonding technology utilized in the previous embodiments. FIG. 4B shows a singulated TFBGA package unit. Beside the use of the flip-chip technology, all the other process steps are the same as the previous embodiments, so description thereof will not be repeated herein.

Various Other Modifications to the Legged Type of Heat-Spreader Frame

Beside the design shown in FIG. 1B, the legged type of heat-spreader frame can have various other modifications, as respectively shown in FIG. 5, FIGS. 6A–6C, FIGS. 7A–7C, FIGS. 8A–8C, FIGS. 9A–9C, and FIGS. 10A–10C. In these figures, similar parts are labeled with the same reference numerals.

Figure 5:
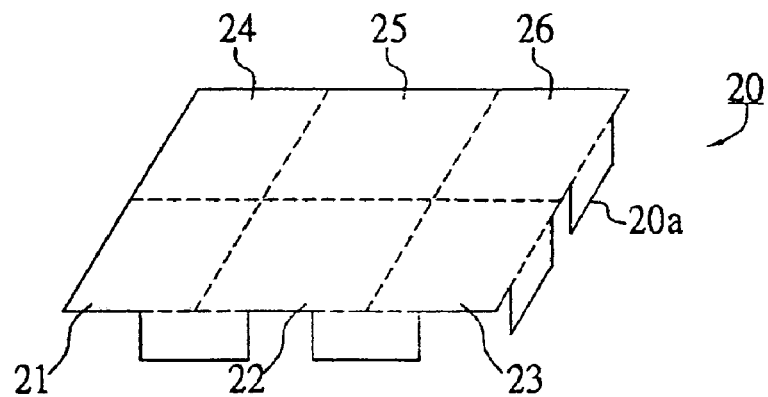
FIG. 5 is a schematic perspective view of a variety to the legged type of heat-spreader frame utilized by the invention.

FIG. 5 is a schematic perspective view of a variety to the legged type of heat-spreader frame 20 utilized by the invention. As shown, in this embodiment, the heat spreaders 21, 22, 23, 24, 25, 26 are integrally formed into a flat piece having a plurality of legs 20a around the edge thereof.

Figure 6A:
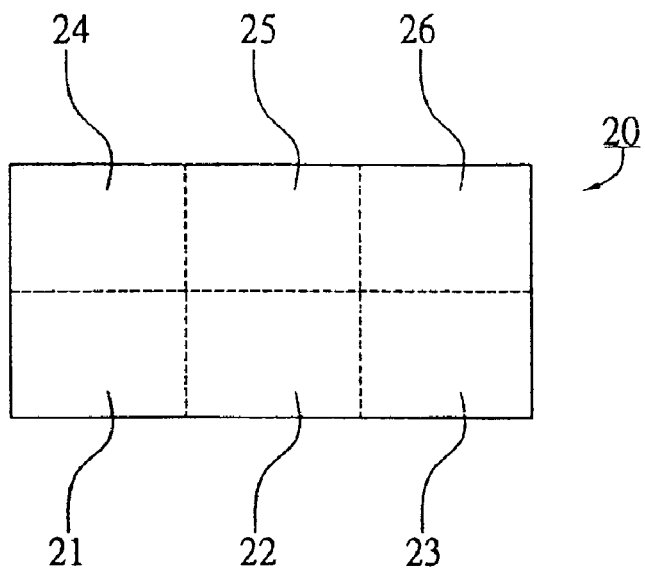
FIGS. 6A–6C are schematic diagrams of another variety to the legged type of heat-spreader frame utilized by the invention.
Figure 6B:
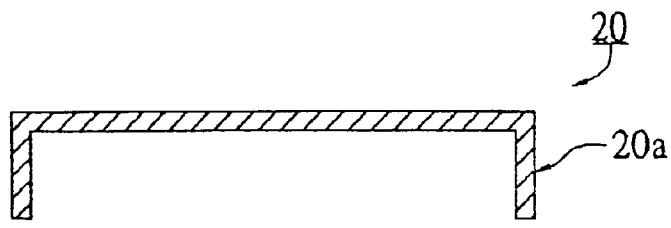
Figure 6C:
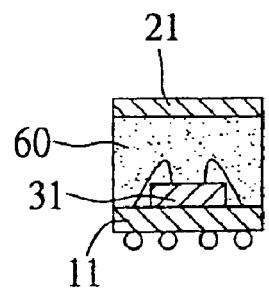

FIGS. 6A–6C are schematic diagrams of another variety to the legged type of heat-spreader frame 20 utilized by the invention; wherein FIG. 6A shows a top view of this heat-spreader frame 20; FIG. 6B shows a side view of the same; and FIG. 6C shows a sin-singulated TFBGA package unit with an embedded heat spreader 21 cutting apart from the heat-spreader frame 20 shown in FIGS. 6A–6B. This heat-spreader frame 20 is characterized in that the heat spreaders 21, 22, 23, 24, 25, 26 are flatly shaped both in front surface and in back surface.

FIGS. 7A–7C are schematic diagrams of still another variety to the legged type of heat-spreader frame 20 utilized by the invention; wherein FIG. 7A shows a bottom view of this heat-spreader frame 20; FIG. 7B shows a side view of the same; and FIG. 7C shows a singulated TFBGA package unit with an embedded heat spreader 21 cutting apart from the heat-spreader frame 20 shown in FIGS. 7A–7B. This heat-spreader frame 20 is characterized in that the heat spreaders 21, 22, 23, 24, 25, 26 are flatly shaped in front surface, and are each formed with a protruded block 20d in the back surface. As shown in FIG. 7C, the provision of the protruded block 20d can help reduce the heat path from the semiconductor chip 31 to the heat spreader 21, so that the heat-dissipation efficiency can be increased.

Figure 8A:
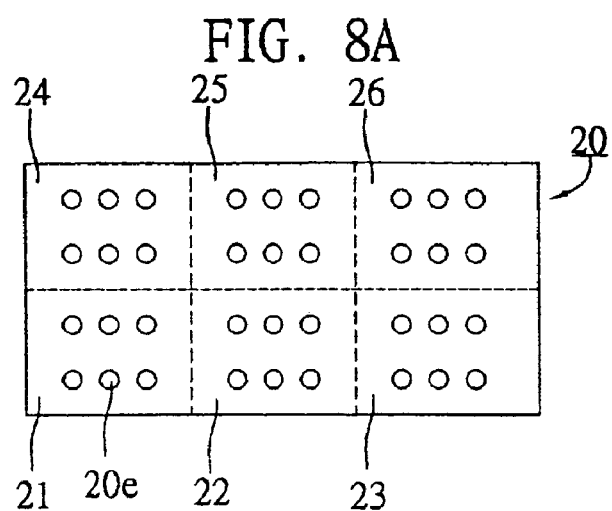
FIGS. 8A–8C are schematic diagrams of yet another variety to the legged type of heat-spreader frame utilized by the invention.
Figure 8B:
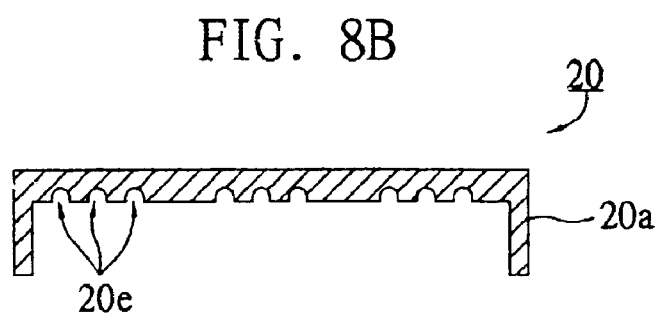
Figure 8C:
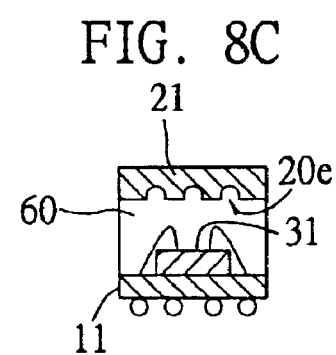

FIGS. 8A–8C are schematic diagrams of still yet another variety to the legged type of heat-spreader frame 20 utilized by the invention; wherein FIG. 8A shows a bottom view of this heat-spreader frame 20; FIG. 8B shows a side view of the same; and FIG. 8C shows a singulated TFBGA package unit with an embedded heat spreader 21 cutting apart from the heat-spreader frame 20 shown in FIGS. 8A–8B. This heat-spreader frame 20 is characterized in that the heat spreaders 21, 22, 23, 24, 25, 26 are flatly shaped in front surface, and are each formed with a plurality of dimples 20e in back surface. As shown in FIG. 8C, the provision of these dimples 20e can help increase the contact area between the heat spreader 21 and the encapsulation body 60, thus further strengthening the bonding between the heat spreader 21 and the encapsulation body 60.

Figure 9A:
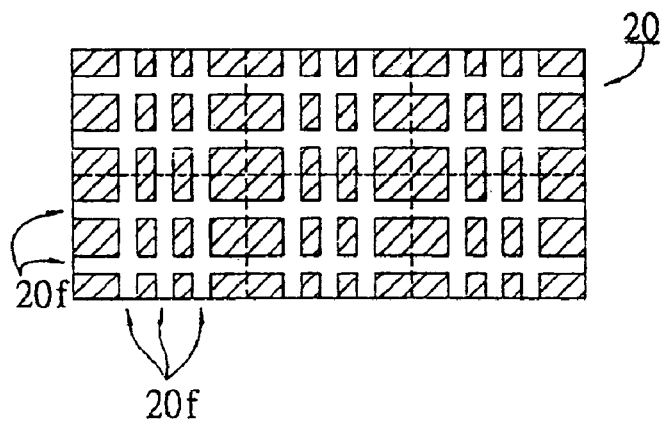
FIGS. 9A–9C are schematic diagrams of still yet another variety to the legged type of heat-spreader frame utilized by the invention.
Figure 9B:
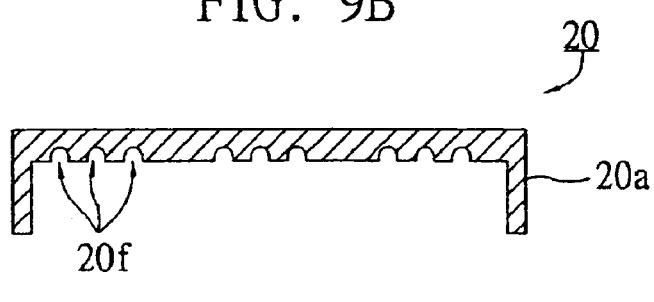
Figure 9C:
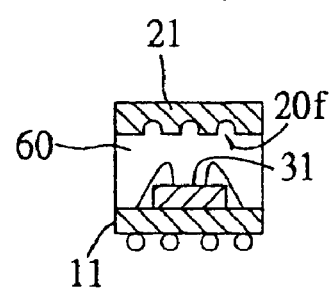

FIGS. 9A–9C are schematic diagrams of yet another variety to the legged type of heat-spreader frame 20 utilized by the invention; wherein FIG. 9A shows a bottom view of this heat-spreader frame 20; FIG. 9B shows a side view of the same; and FIG. 9C shows a singulated TFBGA package unit with an embedded heat spreader 21 cutting apart from the heat-spreader frame 20 shown in FIGS. 9A–9B. This heat-spreader frame 20 is characterized in that the heat spreaders 21, 22, 23, 24, 25, 26 are flatly shaped in front surface, and are each formed with a plurality of crosswise and lengthwise interleaved grooves 20f in back surface. As shown in FIG. 9C, the provision of these grooves 20f can help increase the contact area between the heat spreader 21 and the encapsulation body 60, thus further strengthening the bonding between the heat spreader 21 and the encapsulation body 60.

Figure 10A:
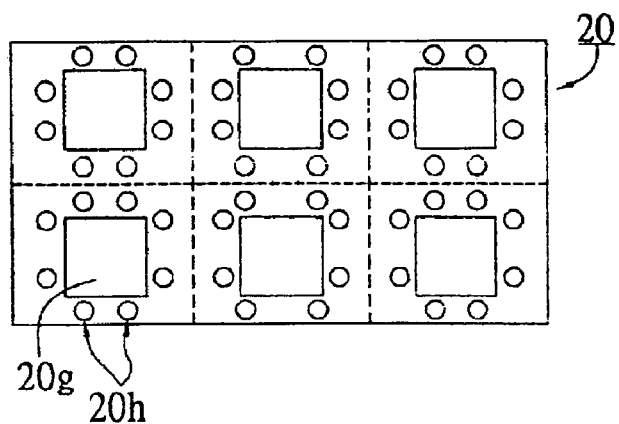
FIGS. 10A–10C are schematic diagrams of another additional variety to the legged type of heat-spreader frame utilized by the invention.
Figure 10B:
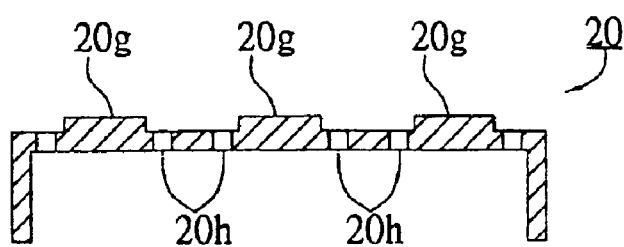
Figure 10C:
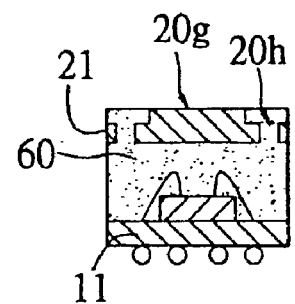

FIGS. 10A–10C are schematic diagrams of another additional variety to the legged type of heat-spreader frame 20 utilized by the invention; wherein FIG. 10A shows a top view of this heat-spreader frame 20; FIG. 10B shows a side view of the same; and FIG. 10C shows a singulated TFBGA package unit with an embedded heat spreader 21 cutting apart from the heat-spreader frame 20 shown in FIGS. 10A–10B. This heat-spreader frame 20 is characterized in that the heat spreaders 21, 22, 23, 24, 25, 26 are each formed with a protruded block 20g in front surface and a plurality of through holes 20h around each protruded block 20g. As shown in FIG. 10C, the provision of the protruded block 20g can help reduce the heat path from the semiconductor chip 31 to the heat spreader 21, while the through holes 20b can act as bolting means that can help secure the heat spreader 21 firmly to the encapsulation body 60, so that the heat spreader 21 would hardly break away from the encapsulation body 60.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an integrated circuit package, comprising the steps of:

(1) preparing a substrate having a front surface and a back surface, and which is predefined with a plurality of package sites;

(2) preparing a heat-spreader frame including a plurality of integrally-formed heat spreaders having a front surface and a back surface, each heat spreader corresponding to one of the predefined package sites on the substrate, wherein the heat-spreader frame is a legged type having a plurality of legs that extend from peripheral edges of the back surface of the heat-spreader frame, the heat-spreader frame being flatly shaped both in the front surface and in the back surface thereof;

(3) bonding and electrically-coupling a plurality of semiconductor chips to respective package sites on the front surface of the substrate;

(4) assembling the heat-spreader frame to the substrate in such a manner that each heat spreader is positioned proximate to one of the semiconductor chips on the substrate, wherein the heat spreaders are elevated above the semiconductor chips by the legs that are situated at the peripheral edges of the heat-spreader frame and abut against the substrate;

(5) performing an encapsulation process to form an encapsulation body which completely encapsulates the semiconductor chips and completely covers the back surface of the heat-spreader frame;

(6) performing a ball-implantation process to implant a plurality of solder balls on the back surface of the substrate; and (7) singulating through the encapsulation body to cut apart the plurality of package sites on the substrate and the plurality of integrally-formed heat spreaders and to cut away the legs situated at the peripheral edges of the heat-spreader frame, so as to form a plurality of individual integrated circuit packages without having the legs of the heat-spreader frame in the packages.

2. The method of claim 1, wherein in said step (1), the substrate is a BT substrate.

3. The method of claim 1, wherein in said step (1), the substrate is an FR4 substrate.

4. The method of claim 1, wherein in said step (1), the substrate is a polyimide tape.

5. The method of claim 1, wherein in said step (3), the bonding and electrically-coupling of the semiconductor chips to the substrate is implemented through wire-bonding technology.

6. The method of claim 1, wherein in said step (3), the bonding and electrically-coupling of the semiconductor chips to the substrate is implemented through flip-chip technology.

7. The method of claim 1, wherein in said step (4), the assembling of the heat-spreader frame to the substrate includes a substep of:

adhering the tips of the legs of the legged-type of heat-spreader frame onto the front surface of the substrate.

8. The method of claim 7, wherein in said step (5), the encapsulation process includes the substeps of:

preparing an encapsulation mold whose bottom side is formed with an upward-recessed cavity; and placing the substrate together the heat-spreader frame in the upward-recessed cavity of the encapsulation mold.

* * * * *